US006202030B1

(12) United States Patent
Hitchcock

(10) Patent No.: US 6,202,030 B1
(45) Date of Patent: *Mar. 13, 2001

(54) CALIBRATING TEST EQUIPMENT

(75) Inventor: Edward Ryer Hitchcock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/467,618

(22) Filed: Dec. 20, 1999

Related U.S. Application Data

(63) Continuation of application No. 09/081,353, filed on May 19, 1997, now Pat. No. 6,032,107.

(51) Int. Cl.$^7$ .............................. G06F 11/00; G01R 31/28
(52) U.S. Cl. ............................ 702/85; 702/118; 702/121; 324/73.1; 714/742
(58) Field of Search .............................. 702/85, 116, 117, 702/118, 119, 120, 121; 324/73.1, 158.1; 714/715, 735, 742

(56) References Cited

U.S. PATENT DOCUMENTS

| | | | | |
|---|---|---|---|---|
| 4,646,299 | * | 2/1987 | Schinabeck et al. | 714/736 |
| 4,928,062 | * | 5/1990 | Miles et al. | 324/766 |
| 5,646,521 | * | 7/1997 | Rosenthal et al. | 324/158.1 |
| 5,668,745 | * | 9/1997 | Day | 702/121 |
| 5,703,489 | * | 12/1997 | Kuroe | 702/116 |
| 6,032,107 | * | 2/2000 | Hitchcock | 702/85 |

* cited by examiner

Primary Examiner—Marc S. Hoff
Assistant Examiner—Bryan Bui
(74) Attorney, Agent, or Firm—Trop, Pruner & Hu, P.C.

(57) ABSTRACT

A method and apparatus are used to calibrate uncalibrated test equipment using reference devices. For each device, the calibrated test equipment is used to test the device to obtain a reference specification value. One of the devices is then selected, and an electrical identification from the selected device is retrieved. The electrical identification is associated with one of the reference specification values. A channel of the uncalibrated test equipment is used to test the selected device to obtain a measured specification value. The reference specification value associated with the electrical identification is compared with the measured specification value. Based on this comparison, the channel is calibrated.

15 Claims, 4 Drawing Sheets

FIG. 5

| Electrical ID Number | Channel #1 $t_{AA}$ Value | Channel #n $t_{AA}$ Value | Channel #1 Dr0 Value | Channel #n Dr0 Value | Channel #1 Spec #1 Value | Channel #n Spec #n Value |
|---|---|---|---|---|---|---|
| 123456 | 7.123 | 7.023 | 2.042 | 1.989 | 5.264 | 3.356 |

CALIBRATING TEST EQUIPMENT

This application is a continuation application of U.S. Ser. No. 09/081,353, filed May 19, 1998, now U.S. Pat. No. 6,032,107.

BACKGROUND INFORMATION

The invention relates to calibrating test equipment.

Automatic test equipment (ATE) is quite often used to rapidly evaluate the performance of electronic devices (e.g., semiconductor memory devices) to determine if the devices meet predetermined specifications (timing specifications, for example). For example, for each device, the equipment might test the device to obtain a measured specification value (a time, for example) that represents how fast the device performs an operation.

The test equipment may obtain a value that differs from a correct, actual specification value for the device. This difference may be caused by one of many possible sources of variation, such as, for example, variations introduced by test patterns and tester channels that are used to test the device.

Referring to FIG. 1, as a result of these variations, the specification values measured by one or more pieces of test equipment may be represented by a Gaussian distribution 10. Typically, the average value of the distribution 10 is very close to the actual specification value. In light of the distribution 10, there is a beta risk and an alpha risk for the testing.

Assuming that the measured specification value is determinative of whether the device passes a quality control test, the beta risk represents the probability that a bad device passes the test. As an example, when a minimum response time (a time $t_{AA}$ of a memory device, for example) is being measured, the beta risk is the portion of the distribution 10 to the left of the average time. Thus, although the device being tested may have an actual time near the average time, the test results may show the device has a faster time. To minimize the beta risk, a guard band threshold 14 is set to reject all times falling on the side of the threshold 14 that is farthest from the average time.

The alpha risk represents the probability that a good device fails the test. As an example, when a minimum response time of the part (e.g., $t_{AA}$) is being measured, the alpha risk is the portion of the distribution 10 to the right of the average time. Thus, although the device being tested may have an actual time near the average time, the test results may show the device has a slower time.

To test a device, typically different channels of the test equipment are connected to different pins of the device. The test equipment uses the channels to drive some of the pins as inputs and monitor some of the pins as outputs. Each channel typically needs to be routinely calibrated. Otherwise, the measured specification values may vary substantially from the actual specification values.

SUMMARY

The invention is generally directed to using reference electronic devices that have electrical identifications to calibrate at least one channel of test equipment.

In one embodiment, a method includes calibrating uncalibrated test equipment using reference devices. The method includes, for each device, using calibrated test equipment to test the device to obtain a reference specification value. The method also includes selecting one of the devices and retrieving an electrical identification from the selected device. The electrical identification is associated with one of the reference specification values. A channel of the uncalibrated test equipment is used to test the selected device to obtain a measured specification value. The reference specification value that is associated with the electrical identification is compared with the measured specification value, and based on the comparison, the channel is calibrated.

In another embodiment, a system is used with reference devices, and each different reference device has a different electrical identification. The system includes a database and test equipment. The database stores reference specification values. Each reference specification value is associated with a different reference device and is obtained by a test of the device that is performed by calibrated test equipment. The test equipment selects one of the devices, retrieves the electrical identification from the device, and uses the identification to retrieve the reference specification value associated with the selected device. The test equipment also uses a channel of the test equipment to test the selected device to obtain a measured specification value. The test equipment compares the reference specification value (that is associated with the electrical identification) with the measured specification value, and based on this comparison, the test equipment calibrates the channel.

Other advantages and features will become apparent from the following description, from the drawing and from the claims.

BRIEF DESCRIPTION OF THE DRAWING

FIG. 5 is a table illustrating specification values measured by the test equipment.

DETAILED DESCRIPTION

Figure 1:
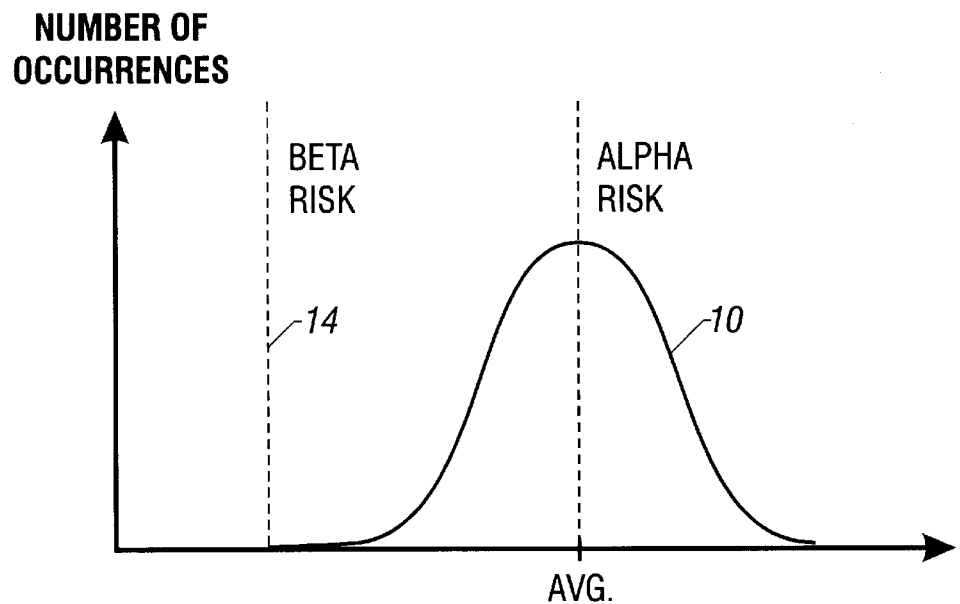
FIG. 1 is a diagram showing a distribution of specification values measured by test equipment.
Figure 2:
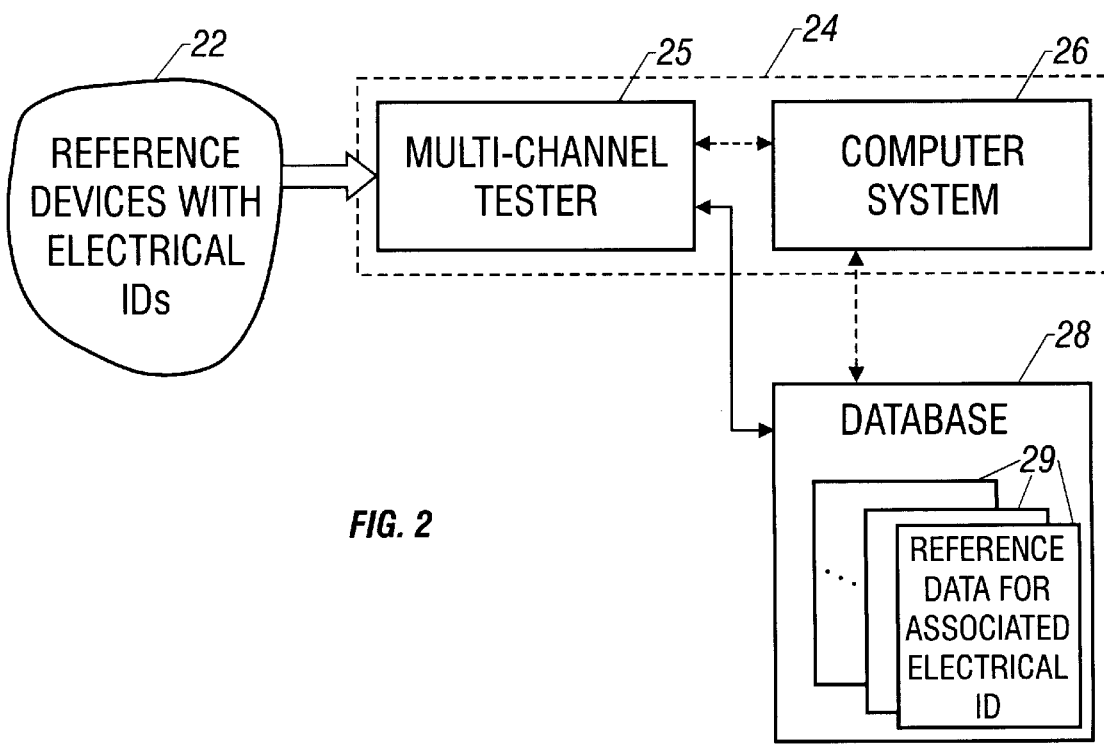
FIG. 2 is block diagram of a system to calibrate test equipment.
Figure 3:
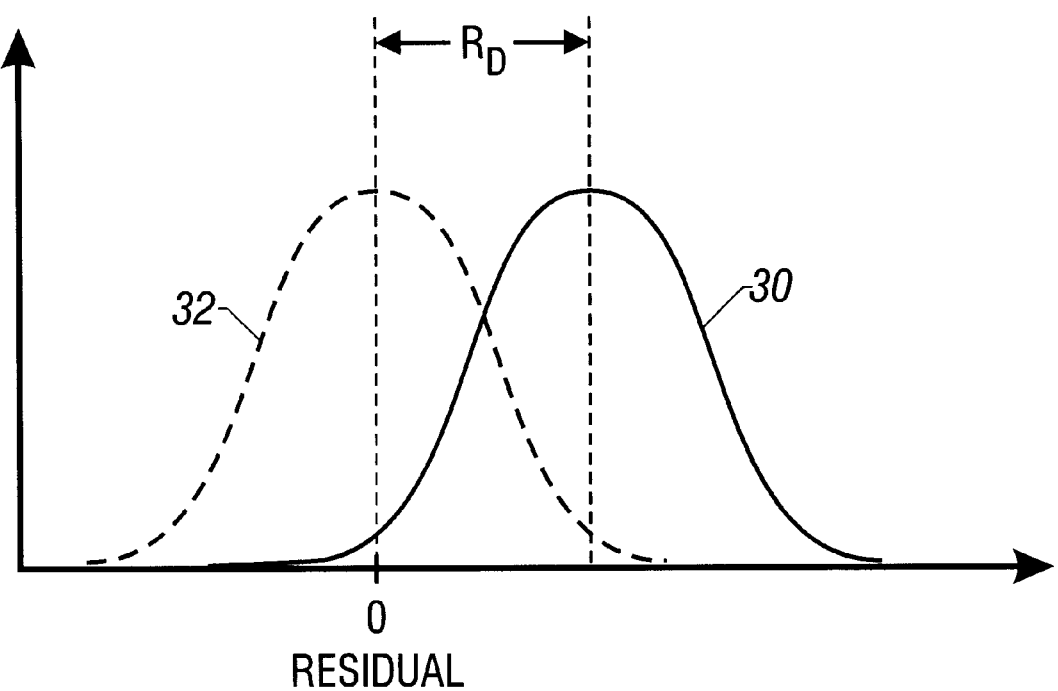
FIG. 3 is a diagram illustrating a distribution of specification values measured by the test equipment of FIG. 3 before calibration.

Referring to FIG. 2, reference electronic devices 22 of the type normally tested by a given piece of equipment are used to calibrate one or more channels of automatic multi-channel automatic test equipment (ATE) 24. In this manner, calibrating a channel includes determining appropriate calibration values to be used to program aspects of the channel. These aspects might include, as examples, a programmable timing, voltage or current. To obtain the appropriate calibration value for one of the aspects, the channel being calibrated is tested for a predetermined specification. The specification that is elected is based on the aspect being calibrated. For example, a time specification (called $t_{AA}$) of the device may be tested to determine (as described below) the appropriate calibration value to program a delay (i.e., an aspect) of the channel.

To determine the appropriate calibration value for a given aspect of a channel, a tester 25 (of the test equipment 24) tests one of the devices 22 to obtain a measured specification value for a predetermined specification (a time $t_{AA}$, for example). A computer system 26 (of the test equipment 24) compares the measured specification value with an actual, reference specification value that was previously obtained by calibrated test equipment (a calibrated channel of the tester 25 or another tester, as examples). From this comparison, the computer system 26 determines the appropriate calibration value, as described below.

Thus, to calibrate one aspect of a channel, the test equipment 24 compares the measured specification value with the reference specification value for that device 22. For a large number of the devices 22, this comparison might be difficult because the devices are rapidly tested by the test equipment 24 in a random sequence. To aid the test equipment 24 in determining which device 22 is being tested (and thus, determine which reference specification value to use), each device 22 has a unique electrical identification number. In this manner, for each device 22 under test, the test equipment 24 retrieves the identification number to identify the device. Based on this identity, the test equipment 24 retrieves the appropriate reference specification value (stored as reference data 29) from a database 28 and uses this value to calibrate the aspect, as described below.

The advantages of using electrical identification numbers to calibrate the test equipment may include one or more of the following. The test equipment may be calibrated while testing devices. No down time is required to calibrate the test equipment. Calibration accuracy is improved. Time required for calibration is minimized.

In some embodiments, the reference device 22 is a semiconductor device, such as a semiconductor memory, and the electrical identification is formed, for example, from a fuse memory of the device during a test mode of the device. The test equipment 24 includes the multi-channel tester 25, and in some embodiments, the test equipment includes the computer system 26 (e.g., a desktop or portable computer) that is configured to aid the tested 25 in testing and/or calibration. In some embodiments, the reference devices 22 are taken from a variety of manufacturing lots to ensure a wide range of reference specification values.

The test equipment 24 is constructed to take corrective measures to calibrate aspects of an uncalibrated channel. These corrective measures might include, for example, programming a calibration value to adjust a calibration digital-to-analog converter (DAC) to adjust such aspects as a skew or delay of the channel.

Figure 4:
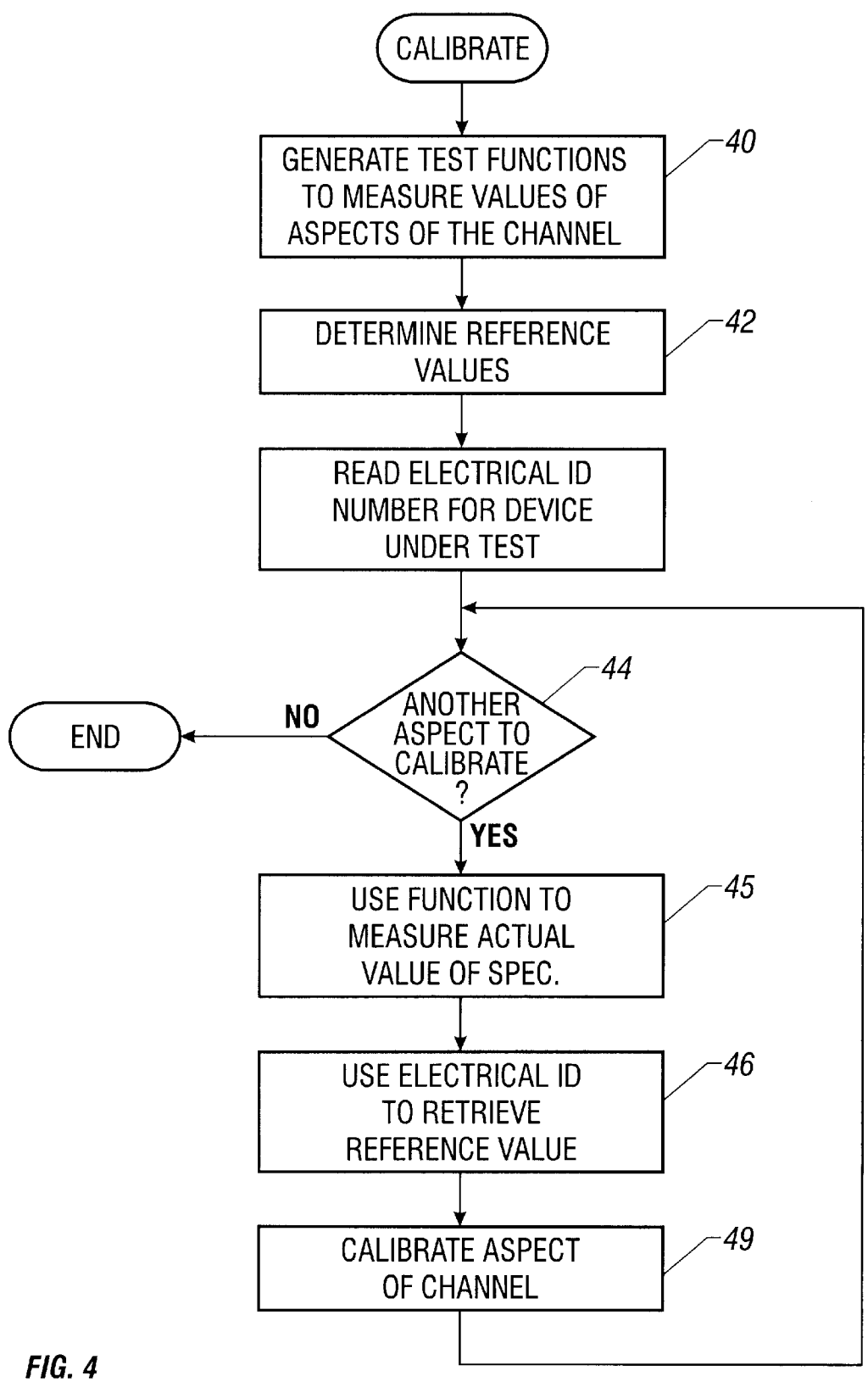
FIG. 4 is a flow diagram illustrating a calibration routine.

Referring to FIG. 4, as an example of a procedure to calibrate one channel of the test equipment 24, test functions are generated (block 40) to measure specification values which the programmable aspects of the channel characterize. For example, the test functions might include a function which configures the tester 25 to measure a time $t_{AA}$ which may, for example, be used to adjust the delay induced by the channel.

Once the reference specification values have been determined for all of the devices, the channel may then be calibrated. In this manner, the computer system 26 uses the tester 25 to read (block 43) the electrical identification of the particular device 22 being tested. Once this identification is determined, the computer system 26 may then retrieve one or more of the associated reference specification values for that device from the database 28.

Next, the computer system 26 determines (diamond 44) whether there is another aspect of the channel to calibrate. If so, the computer system 26 uses the test functions to measure (block 45) the actual value of a specification of the device 22 under test. The computer system 26 then uses (block 46) the electrical identification number of the device 22 to retrieve the associated reference specification value from the database 28. Once the reference specification value is obtained, the computer system 26 may then calibrate (block 49) the aspect of the channel and subsequently determine (diamond 44) whether these is another aspect to calibrate. If not, the calibration procedure is terminated.

For example, referring to FIG. 5, the tester 25 may measure a time $t_{AA}$ of the device 22 to calibrate a delay of channel number one. To accomplish this, the tester 25 may, for example, measure a time $t_{AA}$ of the device 22. The reference $t_{AA}$ value may be 7.010 ns, for example. However, the measured specification value may be 7.123 ns. The current calibration value being used to compensate for a delay in channel number one may then be compensated according to the following equation:

new calibration value=current calibration value+(measured specification value−reference specification value)

Thus, for this example, if the calibration value represents nanoseconds, "0.013" may be added to the current calibration value to adjust the delay of channel number one.

Although the above discussion refers to one aspect of a channel being calibrated at one time, in some embodiments, several aspects of a channel and several channels maybe calibrated at once. In this manner, a sufficient number of the devices 22 are used to keep the equipment testing and to generate enough test values to properly characterize the performance of the channels.

In some embodiments, the reference devices 22 are used to calibrate the equipment 24 when the equipment 24 is not testing other devices. However, in other embodiments, the reference devices 22 are intermingled with other devices that are being tested. In these embodiments, the test equipment is configured to recognize (via the electrical identification) the reference devices 22 and, in response, calibrate aspect(s) of channel(s). In this manner, the test equipment 24 continuously tests these devices 22 and performs an ongoing calibration of its channels.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A method for calibrating test equipment using reference multiple pin devices that are associated with reference values, the method comprising:

selecting one of the multiple pin devices;

retrieving an electrical identification from the selected device, the electrical identification associated with one of the reference values;

using the test equipment to test the selected device to obtain a measured value;

comparing the reference value associated with the electrical identification with the measured value; and based on the comparison, calibrating the test equipment.

2. The method of claim 1, wherein the act of calibrating comprises:

calibrating a channel of the test equipment.

3. The method of claim 1, wherein the act of comparing includes calculating a difference between the measured and reference values.

4. The method of claim 1, further comprising:

using uncalibrated test equipment to test the multiple pin reference devices to obtain the reference specification values.

5. The method of claim 1, wherein the act of calibrating includes:

determining a difference between the reference and measured values; and adding the difference to a calibration value used to calibrate a channel of the test equipment.

6. The method of claim 1, wherein the electrical identification comprises an identity formed by fuses.

7. A method for calibrating channels of test equipment using multiple pin reference devices, each multiple pin reference device including a readable electrical identification, the method comprising:

reading the electrical identifications from the multiple pin reference devices, the electrical identifications being associated with reference values;

testing the multiple pin reference devices using the test equipment; and comparing the results of the testing with the reference values to the calibrate the channels.

8. The method of claim 7, wherein the act of calibrating the channels includes adjusting a delay of one of the channels.

9. The method of claim 7, wherein the act of calibrating the channels includes adjusting a skew of one of the channels.

10. A system for use with multiple pin reference devices, each different device having a different electrical identification, the system comprising:

a database storing reference values, each reference value being associated with a different one of the multiple pin reference devices; and test equipment adapted to:
read electrical identifications from the multiple pin reference devices and use the identifications to retrieve the reference values associated with the selected multiple pin reference devices from the database,
use the test equipment to test the selected multiple pin reference devices to obtain measured values, and
calibrate the test equipment based on the measured and reference values.

11. The system of claim 10, wherein the test equipment is adapted to calibrate calculating a difference between the measured and reference values.

12. The system of claim 10, wherein the calibration by the test equipment includes:

determining a difference between the reference and measured values; and adding the difference to a calibration value used to calibrate a channel of the test equipment.

13. A system for use with multiple pin reference devices, each multiple pin reference device having an electrical identification, the system comprising:

a database storing reference specification values, each different reference specification value associated with a different one of the electrical identifications; and test equipment configured to:
test multiple pin reference devices with a channel of the test equipment to obtain measured specification values, and
based on results of the test, calibrate the channel.

14. The system of claim 13, wherein the test equipment is configured to calibrate the channel by comparing the measured specification values with the reference specification values that are associated with the electrical identifications.

15. The system of claim 13, wherein the calibration by the test equipment includes:

determining a difference between the reference and measured specification values; and adding the difference to a calibration value used to calibrate the channel.

* * * * *